(12) United States Patent
Tanaka et al.

(10) Patent No.: US 6,593,767 B1
(45) Date of Patent: Jul. 15, 2003

(54) LEAK DETECTION METHOD FOR ELECTRICAL EQUIPMENT

(75) Inventors: Toshimasa Tanaka, Seto (JP); Tsuyoshi Hosoito, Inuyama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/663,344

(22) Filed: Sep. 15, 2000

(30) Foreign Application Priority Data

Sep. 17, 1999 (JP) .......................................... 11-264144

(51) Int. Cl.$^7$ ........................ G01R 31/34; G01R 31/00; G01R 31/06; H02H 3/00
(52) U.S. Cl. ........................ 324/772; 324/509; 324/546; 324/510; 361/42
(58) Field of Search ................................ 324/772, 509, 324/546, 570; 361/42; 318/490; 322/25

(56) References Cited

U.S. PATENT DOCUMENTS

| | | | | |
|---|---|---|---|---|
| 4,159,501 A | * | 6/1979 | White ......................... 361/47 |
| 4,187,525 A | * | 2/1980 | Nagura et al. | |
| 4,355,274 A | * | 10/1982 | Bourbeau ................... 318/812 |
| 4,540,922 A | | 9/1985 | Horvath et al. ............. 318/490 |
| 4,634,991 A | * | 1/1987 | Mastrojeni ................... 329/333 |
| 4,716,487 A | | 12/1987 | Horvath et al. .............. 361/42 |
| 4,716,509 A | * | 12/1987 | Roccucci ..................... 363/26 |
| 5,218,194 A | * | 6/1993 | Garbi et al. .......... 250/214 VT |
| 6,057,996 A | * | 5/2000 | Kim ........................... 361/42 |

FOREIGN PATENT DOCUMENTS

| | | |
|---|---|---|
| JP | 2-131395 | 5/1990 |
| JP | 11-103591 | 4/1999 |

OTHER PUBLICATIONS

European Search Report re: 00308057.9 dated Jan. 15, 2001.

* cited by examiner

*Primary Examiner*—N. Le
*Assistant Examiner*—Wasseem H. Hamdan
(74) *Attorney, Agent, or Firm*—Pillsbury Winthrop LLP

(57) ABSTRACT

A leak detection method for electrical equipment provided with an electric motor, includes the step of detecting, during non-energization of the motor, a voltage generated in a voltage-dividing resistor provided between a winding of the motor and ground, thereby detecting leak produced in the motor.

9 Claims, 10 Drawing Sheets

FIG.5A (GROUNDED)

| PRESISTORS 60a-60c | RESISTOR 60d | LEAK CURRENT | A/D INPUT VOLTAGE (AVERAGE) |
|---|---|---|---|
| 910KΩ | 9.1KΩ | 0.45mA | 4.5V |
| | | 0.17mA | 1.7V (REFERENCE VOLTAGE) |
| | | 0.11mA | 1.1V |
| | | 0.01mA | 0.1V |

FIG.5B (NOT GROUNDED)

| PRESISTORS 60a-60c | RESISTOR 60d | LEAK CURRENT | A/D INPUT VOLTAGE (PEAK) |
|---|---|---|---|
| 910KΩ | 9.1KΩ | 0.45mA | 3.6V |
| | | 0.17mA | 1.36V (REFERENCE VOLTAGE) |
| | | 0.11mA | 0.88V |
| | | 0.01mA | 0.08V |

LEAK DETECTION METHOD FOR ELECTRICAL EQUIPMENT

BACKGROUND OF THE INVENTION

1. Field of the Invention

This invention relates to a leak detection method for electrical equipment provided with an electric motor.

2. Description of the Prior Art

FIG. 10 shows an electric circuit for electrical equipment or, for example, a washing machine. A feeder circuit for a washing machine motor 1 will be described. A DC power supply circuit 4 is connected via a power switch 3 to a commercial AC power source 2. The DC power supply circuit 4 comprises a voltage doubler rectifier circuit 8 composed of a diode bridge 5 and capacitors 6 and 7 connected as shown in the figure, and a voltage regulator circuit 9. An inverter main circuit 10 is connected to an output side of the DC power supply circuit 4 and comprises six switching elements 10a to 10f. The motor 1 includes phase windings 1u, 1v and 1w all connected to the inverter main circuit 10. A control circuit 11 comprising a microcomputer controls a switching element drive circuit 12 further connected to the switching elements 10a to 10f so that the switching elements are turned on and off. The control circuit 11 further controls a water-supply valve 13, a drain valve, etc.

On the other hand, a zero-phase-sequence current transformer 16 is provided on a feed path between the AC power source 2 and the DC power supply circuit 4. The transformer 16 delivers an output signal via a detecting resistance 16a to a leak detection circuit 17. The zero-phase-sequence current transformer 16 and the leak detection circuit 17 constitute a leak detector 18. The leak detection circuit 17 comprises an amplifier circuit, a reference voltage generating circuit and a comparator circuit.

When leak occurs in the motor 1 during energization of the motor, only an amount of current obtained by subtracting a leaked current from a current supplied from the AC power source 2 is returned to the source. Accordingly, an amount of positive current is unequal to an amount of negative current, whereupon a detection current is produced in the transformer 16. When the detection current is delivered as a corresponding detection voltage from the detector resistance 16a, the voltage is amplified by the leak detection circuit 17 and further compared with a reference value, so that the presence or absence of the leak is detected.

In the above-described arrangement, however, the leak detection circuit 17 of the leak detector 18 consumes a large amount of power. Further, the leak detection circuit 17 necessitates a high precision and high gain amplifier circuit since it detects a slight unbalance of load current. Such an amplifier circuit increases the cost. Additionally, leak can be detected only during energization of the motor 1, namely, the motor 1 needs to be actually driven for the leak detection.

SUMMARY OF THE INVENTION

Therefore, an object of the present invention is to provide a current leak detection method for a washing machine which can reduce the power consumption and eliminate the high precision circuit to thereby reduce the cost, and in which leak can be detected without driving the motor.

The present invention provides a current leak detection method for a washing machine provided with an electric motor, an inverter circuit driving the electric motor and a voltage doubler rectifier circuit supplying driving power to the inverter circuit and including two capacitors having a neutral point connected to a grounded side of an AC power supply, the voltage double rectifier circuit having a ground potential set to be equal to a ground potential of an internal circuit of the washing machine. The washing machine including an outer cabinet having a potential set at a value differing from a ground potential of an internal circuit thereof, the method comprising detecting, during non-energization of the motor, a voltage generated in a voltage-dividing resistor provided between a winding of the motor and ground on the internal circuit, thereby detecting leak produced in the motor.

According the above-described method, no voltage is applied to the motor winding when no leak occurs between the motor and the outer cabinet of the washing machine during non-energization thereof. Accordingly, no voltage is generated in the voltage-dividing resistor. On the other hand, when leak occurs between them during non-energization of the motor, a potential difference between the outer cabinet and a ground on the internal circuit causes current to flow from the motor winding to the resistor such that voltage is produced in the resistor. Accordingly, the voltage produced in the voltage-dividing resistor is detected during non-energization of the motor, whereby leak produced in the motor can be detected. Since the leak can be detected by such a simple and less expensive arrangement that the voltage-dividing resistor is provided, the cost can be reduced and power consumption can be reduced. Additionally, leak can be detected without driving the motor.

In a first preferred form, the leak detection is carried out after the washing machine is connected to a power supply and before the motor is operated. Since the leak is detected before operation of the motor, the safety can be improved. In a second preferred form, the motor is energized from a DC power supply obtained by converting and AC power supply, the method further comprising determining whether the voltage generated in the voltage-dividing resistor has, a dc waveform or a pulsating waveform, with the outer cabinet of the washing machine being connected to a neutral point of a capacitor dividing the AC power supply, setting a reference voltage according to a result of determination, and comparing the voltage produced in the voltage-dividing resistor with the reference value, thereby detecting the leak.

Generally, when the user uses the washing machine, an outer cabinet of the washing machine is grounded by the user for prevention of electrical shock. When a power supply for the motor is energized from a DC power supply obtained by converting an AC power supply, the motor power supply is a stable direct current. When leak occurs in the washing machine, voltage having a direct current waveform is detected in the voltage dividing resistor. Further, when the outer cabinet of the washing machine is not grounded, the motor power contains the pulsating waveform since the outer cabinet of the washing machine is connected to a neutral point of a capacitor dividing the AC power supply.

Upon occurrence of leak in this state, voltage having the pulsating waveform is produced in the voltage-dividing resistor.

Moreover, the dc waveform and the pulsating waveform have different correspondences to the actual leak current. That is, when the leak currents are equal to each other between the dc waveform and the pulsating waveform, the voltage having the dc waveform is higher than the voltage having the pulsating waveform. Accordingly, in a case where the leak detection is carried out with the same reference voltage, it is determined that leak has occurred, when the generated voltage has the dc waveform, though it is determined that no leak has occurred, when the generated voltage has the pulsating waveform.

In the above described method, however, it is determined whether the voltage generated in the voltage-dividing resistor has, the dc or pulsating waveform. The reference voltage is set according to the result of determination. The generated voltage is compared with the reference voltage so that leak is detected. Consequently, the occurrence of leak can reliably be detected whether the outer cabinet of the washing machine is grounded or not.

In a second preferred form, the leak detection method further comprises connecting a ground detecting circuit having a series circuit of a switching element and a resistor between an electrical equipment housing or an earth wire provided on the housing and a power input side of the winding, turning on the switching element to determine which voltage generated in the voltage-dividing resistor has, a dc waveform or a pulsating waveform, and warning when the voltage has the pulsating waveform.

Whether the user has grounded an electrical equipment housing can be determined by determining which one of the dc waveform and the pulsating waveform the voltage generated in the voltage-dividing resistor has. However, this is on the assumption that leak has already occurred. On the other hand, in the invention, the ground detecting circuit is connected between the electrical equipment housing or the earth wire provided on the housing and the power input side of the winding. A suspected leak can occur when the switching element is turned on. It is determined which voltage generated in the voltage-dividing resistor has, the dc waveform or the pulsating waveform. Consequently, even when leak has not actually occurred, the user can determine whether the electrical equipment housing is grounded. Further, since the warning is carried out when the voltage has the pulsating waveform, the user can be informed of an ungrounded state of the electrical equipment housing.

BRIEF DESCRIPTION OF THE DRAWINGS

Other objects, features and advantages of the present invention will become clear upon reviewing the following description of the preferred embodiments, made with reference to the accompanying drawings, in which:

FIGS. 5A and 5B show the relationship between leak current and generated voltage;

DETAILED DESCRIPTION OF THE PREFERRED EMBODIMENTS

Figure 1:
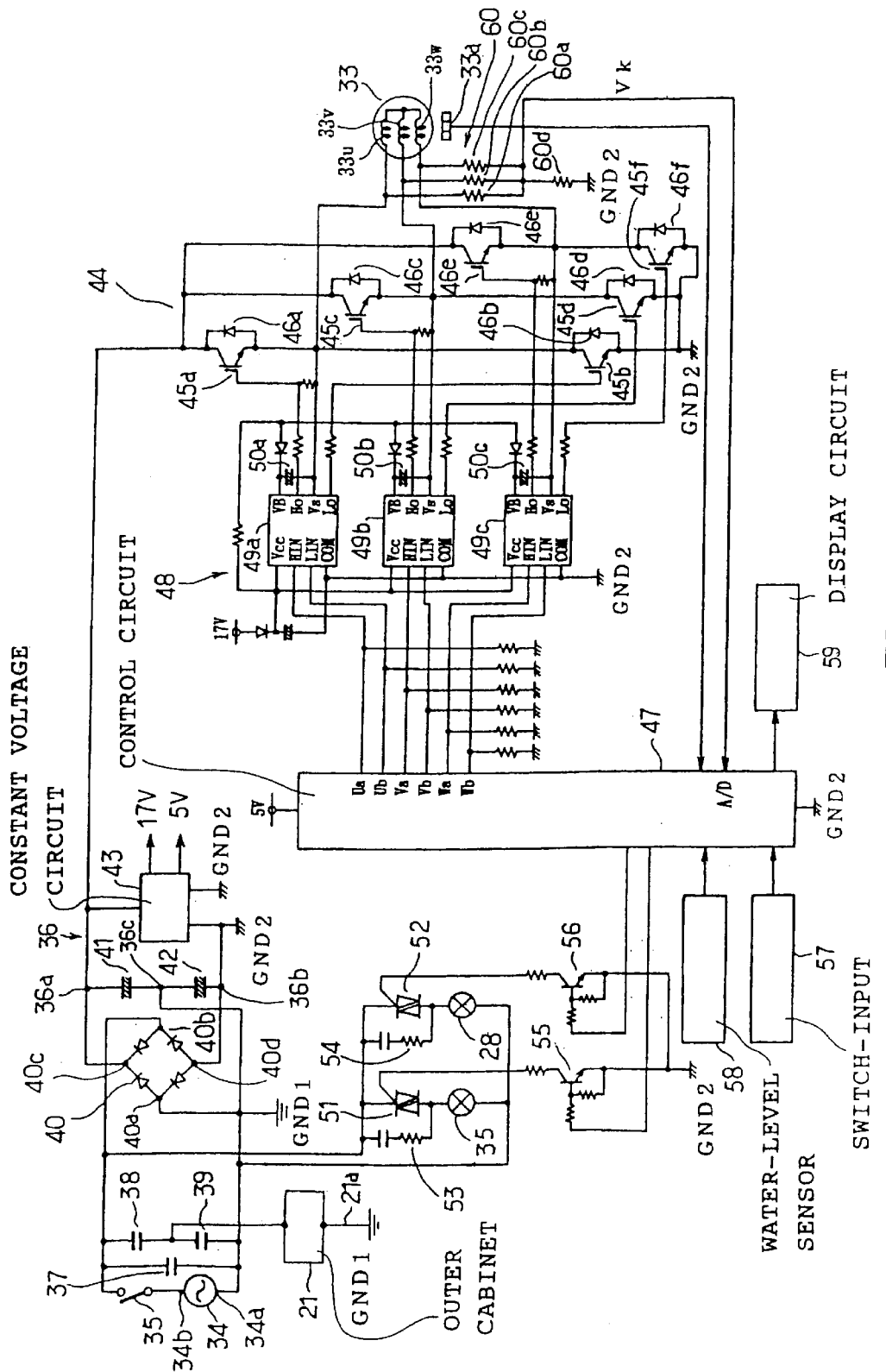
FIG. 1 is an electrical circuit diagram of the washing machine of a first embodiment in accordance with the present invention.
Figure 2:
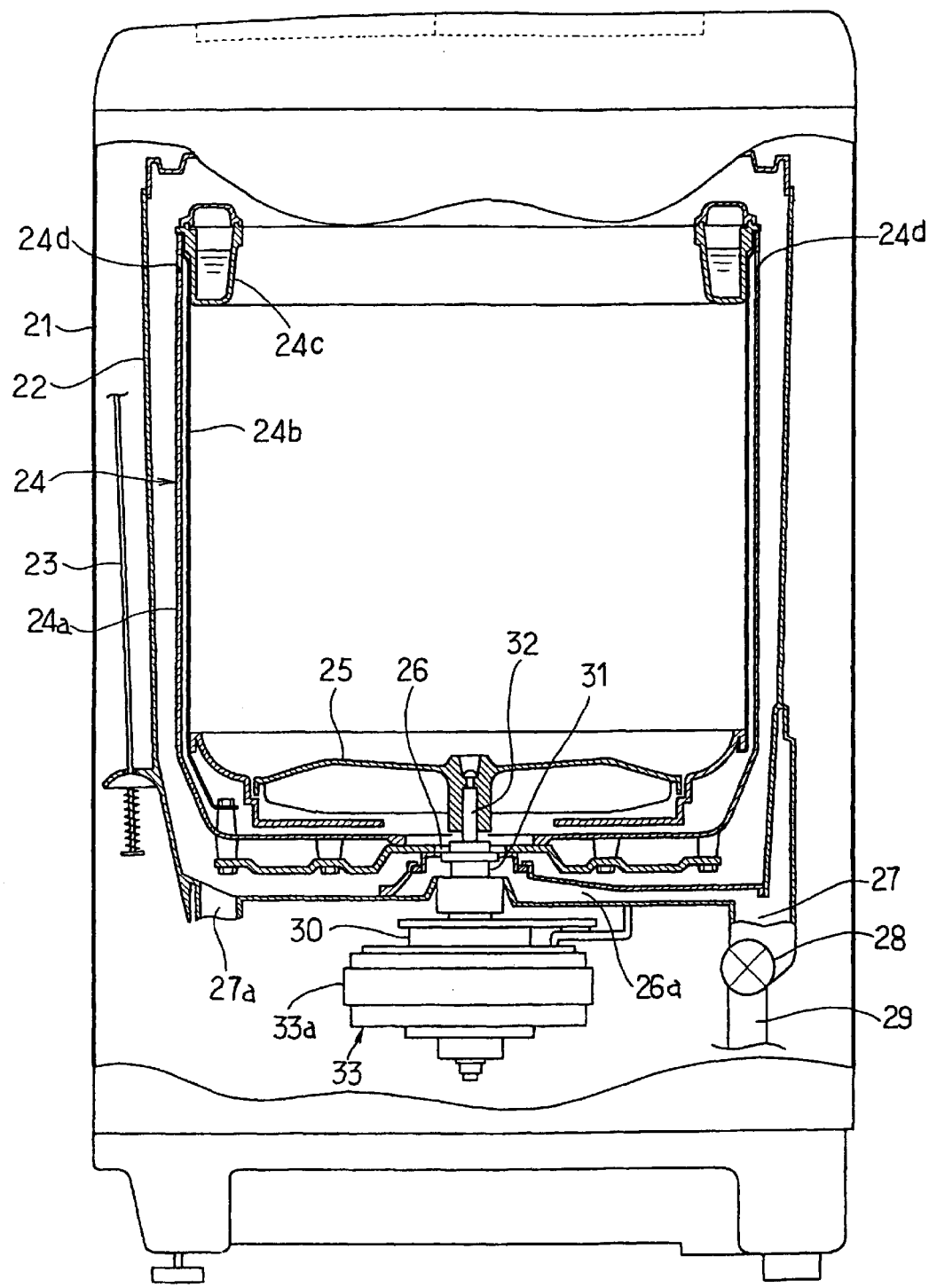
FIG. 2 is a longitudinally sectional side view of the washing machine.

Several embodiments in each of which the present invention is applied to a washing machine will be described with reference to the drawings. FIGS. 1 to 5B illustrate a first embodiment. Referring first to FIG. 2, the overall washing machine is shown. The washing machine comprises an outer cabinet 21 serving as electrical equipment housing. An outer tub 22 is mounted on a plurality of suspension mechanisms 23 in the outer cabinet 21. Only one of the suspension mechanisms 23 is shown in FIG. 2. A rotatable tub 24 serving as a wash tub and a dehydration tub is rotatably mounted in the outer tub 22. The rotatable tub 24 comprises a body 24a, an inner cylinder 24b mounted inside the body and a balance ring 24c. When the tub 24 is rotated, a centrifugal force causes water in it to rise up so that the water is discharged into the outer tub 22 through dehydration holes 24d formed in an upper portion of the body 24a.

The rotatable tub 24 has a through hole 26 formed in the bottom thereof. The hole 26 communicates via a drain passage 26a with a drain hole 27. A drain channel 29 with a drain valve 28 is connected to the hole 26. Accordingly, when supplied into the rotatable tub 24 with the drain valve 28 being closed, water is reserved in the tub 24. When the drain valve 28 is opened, the water in the tub 24 is discharged through the drain passage 26a, drain hole 27 and drain channel 29. The tub 24 further has an auxiliary drain hole 27a formed in the bottom thereof. The auxiliary drain hole 27a is connected via a connecting hose to the drain channel 29, bypassing the drain valve 28. When the tub 24 is rotated, the water discharged out of the upper interior thereof into the outer tub 22 is drained through the auxiliary drain hole 27a.

A mechanism housing 30 is mounted on the underside of the bottom of the outer tub 22. A hollow tub shaft 31 is rotatably mounted on the mechanism housing 30. The rotatable tub 24 is connected to the tub shaft 31. An agitator shaft 32 is rotatably mounted in the tub shaft 31. The agitator shaft 32 has an upper end to which an agitator 25 is connected. Further, the agitator shaft 32 has a lower end connected to a rotor 33a of a washing machine motor 33 comprising a brushless DC motor of the outer rotor type, for example. The motor 33 is driven in a wash step to rotate the agitator 25 in normal and reverse directions alternately repeatedly. The motor 33 is further driven in a dehydration step to rotate the tub 24 and the agitator 24 in one direction together with the shafts 31 and 32 being connected together by a clutch (not shown).

An electrical arrangement of the washing machine will be described with reference to FIG. 1. A DC power supply circuit 36 serving as a power supply for the motor 33 is connected via a power supply switch 35 to a commercial AC power source 34 of 100V. A noise eliminating capacitor 37 is connected in parallel with a series circuit of the AC power source 34 and the power supply switch 35. A series circuit of two capacitors 38 and 39 is connected to the capacitor 37. A node of the capacitors 38 and 39 is connected to the outer cabinet 21 provided with an earth wire 21a which is used when the user grounds the washing machine.

The DC power supply circuit 36 comprises a voltage doubler rectifier circuit including a diode bridge rectifier circuit 40 and smoothing capacitors 41 and 42. More specifically, the rectifier circuit 40 has an input terminal 40a connected to a power supply terminal 34a of the AC power source 34 and another input terminal 40b connected via the power switch 35 to a power supply terminal 34b of the AC power source. The rectifier circuit 40 has two output terminals 40a and 40b between which the smoothing capacitors 41 and 42 are connected in series to them. A node of the smoothing capacitors 41 and 42 is connected to an input terminal 40a of the rectifier circuit 40. The DC power supply circuit 36 has a voltage of 0 V at the neutral point 36c, a voltage of +141V at a positive output terminal 36a and a voltage of −141V at a negative output terminal 36b, so that a DC voltage of 282V is generated between the positive and negative output terminals 36a and 36b. The negative output terminal 36b is connected to the ground on the circuit or chassis. Reference symbol "GND1" (0 V) designates direct ground, whereas reference symbol "GND2" (−141 V) indirect ground on the circuit.

A controlled power supply circuit or constant voltage circuit 43 is connected to the DC power supply circuit 36. The constant voltage circuit 43 delivers a constant voltage of 17 V and a constant voltage of 5 V. An inverter main circuit 44 serving as a motor drive circuit is also connected to the DC power supply circuit 36. The constant voltage circuit 43 supplies a power supply of 5 V to a control circuit 47 which will be described later and a power supply of 17 V to a switching element drive circuit 48. The inverter main circuit 44 comprises six switching elements 45a to 45f comprising IGBTs respectively, for example. The switching elements 45a–45f are connected into a three-phase bridge configuration. The inverter main circuit 44 further comprises six freewheel diodes 46a to 46f connected to the respective switching elements 45a–45f in a polarity as shown in FIG. 1.

Phase bridges have output terminals connected to the phase windings 33u, 33v and 33w of the stator of the motor 33 respectively, whereby the motor 33 is driven by the inverter main circuit 44. The control circuit 47 controls the switching element drive circuit 48 so that the switching elements 45a to 45f are controlled to be turned on and off. The control circuit 47 comprises a microcomputer, an A/D converter, etc. In particular, the A/D converter used for leak detection carries out an A/D conversion of an input voltage in a period sufficiently shorter than a period of the commercial AC power source 34. Three position sensing elements 33a are disposed on the motor 33 for sensing a rotor position, thereby delivering position signals which are supplied to the control circuit 47.

The switching element drive circuit 48 comprises three charge pump type voltage converter circuits 49a, 49b and 49c, and three charge pump capacitors 50a, 50b and 50c. The voltage converter circuits 49a–49c cause the capacitors 50a–50c to charge and generate gate voltages which are supplied to the gate terminals of the switching elements 45a, 45b and 45c at the high side of arms, respectively. A series circuit of the water-supply valve 35 and a triac 51 is connected between the power supply terminals 34a of the AC power source 34. A series circuit of the drain valve 28 and a triac 52 is connected in parallel with the series circuit of the water-supply valve 35 and the triac 51. Noise eliminating snubber circuits 53 and 54 are connected to the triacs 51 and 52 respectively. The triac 51 has a gate terminal connected via an NPN transistor 55 to the indirect ground.

A voltage-dividing resistor 60 is provided between the power input sides of the windings 33u, 33v and 33w of the motor 33 and the indirect ground. The resistor 60 comprises three upper resistors 60a, 60b and 60c having respective one ends connected to the power input sides of the windings 33u, 33v and 33w and a lower resistor 60d having one end connected to the upper resistors and the other end connected to the indirect ground. Each upper resistor has a resistance value of 910 KΩ and the lower resistor 60d has a resistance value of 9.1 KΩ. A node of the upper resistors 60a, 60b and 60c and the lower node 60d is connected to an input side of an A/D converter incorporated in the control circuit 47.

The control circuit 47 controls the leak detection as well as the washing operation. The control circuit 47 starts when the power switch 35 is turned on. For example, when receiving a start switch signal for an automatic washing course from the switch input circuit 57, the control circuit 47 performs a control so that a water supply step, a wash step, a drain step and a dehydration step are carried out in a suitable combined manner. In the water supply step, the water-supply valve 35 is opened until a predetermined water level is reached. The motor 33 is driven in the normal and reverse directions alternately repeatedly in the wash step. The drain valve 28 is opened in the drain step. The motor 33 is driven in one direction in the dehydration step. The windings 33u, 33v and 33w of the motor 33 are suitably energized according to a combination of on-off pattern of the switching elements 45a–45f of the inverter main circuit 44. The motor 33 is deenergized when the switching elements 45a–45f are turned off.

Figure 3:
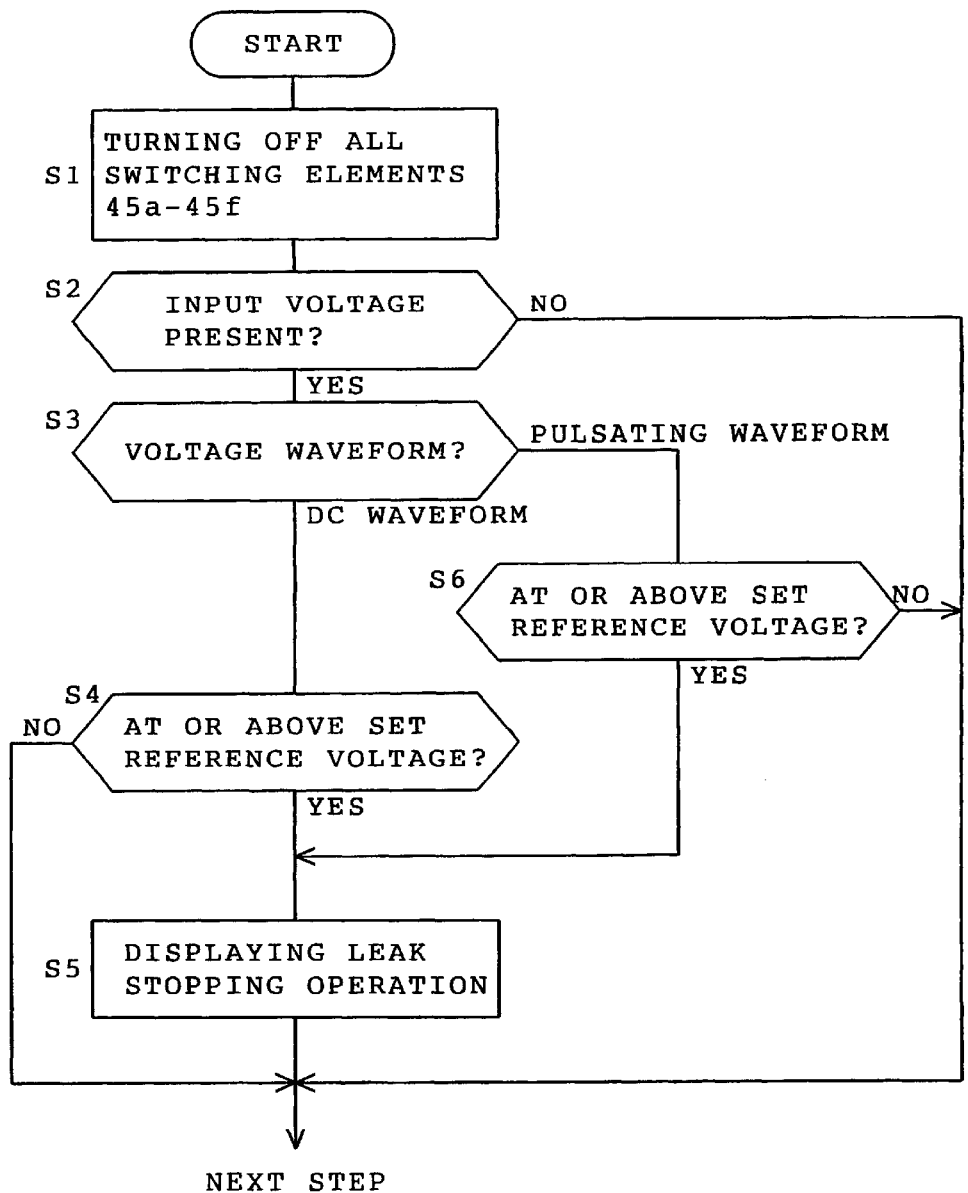
FIG. 3 is a flowchart showing the control contents of the control device.

The control circuit 47 controls the leak detection when the motor 33 is deenergized, for example, before the start switch for the washing course is turned on after the power switch 35 has been turned on. More specifically, the control circuit 47 detects voltage Vk generated in the voltage-dividing resistor 60 when the motor 33 is deenergized, thereby detecting leak produced in the motor. FIG. 3 shows the control for the leak detection. The control starts when the power switch 35 is turned on. All the switching elements 45a–45f are turned off at step S1. At step S2, the control circuit 47 determines whether the voltage Vk generated in the voltage-dividing resistor 60 has been input. More specifically, the generated voltage Vk is read by the A/D converter in synchronism with a frequency higher than a power supply frequency (50 or 60 Hz) of the AC power source 34, namely, the A/D conversion is performed in a period sufficiently shorter than a period of the AC power supply 34 so that whether the voltage Vk has been input is determined. In this case, an A/D conversion period is set at about 1 msec, for example. The voltage Vk is at 0 V or a very small value when no leak has occurred between the motor 33 and the outer cabinet 21. Accordingly, an input voltage to the A/D converter of the control circuit 47 is at zero or substantially zero.

When the outer cabinet 21 and the motor 33 are electrically conductive or leak is caused, the potential at the input side of each of the windings 33u, 33v and 33w is not at zero, but a voltage obtained by subtracting voltage drop due to leak resistance from the potential (0 V) of the outer cabinet 21. At this time, the potential of the other end GND2 of the voltage-dividing resistor 60 is at −141 V and accordingly lower than the potential of the outer cabinet 21. As a result, a leak current flows from the outer cabinet 21 toward the resistor 60. Thus, when leak has occurred, the voltage-dividing resistor 60 generates voltage in proportion to the leak current.

Figure 4A:
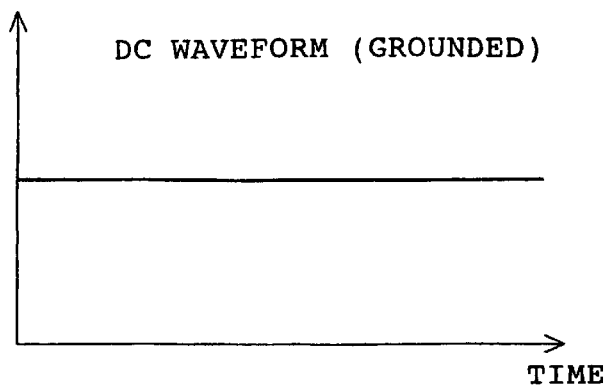
FIGS. 4A and 4B are graphs of generated voltages.
Figure 4B:
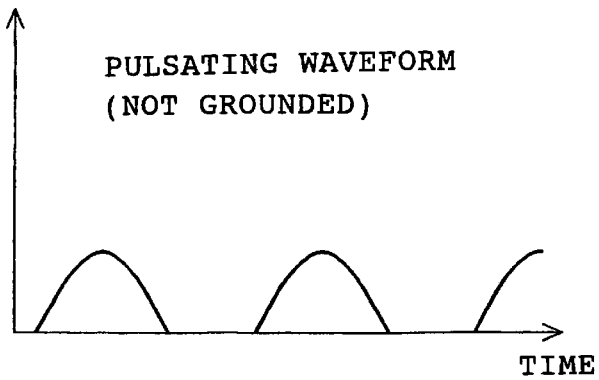

When determining at step S2 that no voltage Vk has been input, the control circuit 47 determines that no leak has occurred, advancing to a next control step. When voltage Vk has been input, the control circuit 47 advances to step S3 to determine which the voltage Vk has, a DC waveform or a pulsating waveform. In the washing machine of the embodiment, the user connects the earth wire 21a to the earth so that the outer cabinet 21 is grounded. However, some users forget to connect the earth cable 21a to the earth. The voltage Vk generated by the resistor 60 takes different voltage waveforms between the case where the earth wire 21a is connected to the earth and the case where the earth wire 21a is not connected to the earth. The leak current is a stable direct current when the outer cabinet 21 is grounded. As a result, the resistor 60 generates voltage having a dc waveform as shown in FIG. 4A. The leak current has a pulsating waveform due to the AC power source 34 when the outer cabinet 21 is not grounded. As a result, the resistor 60 generates voltage having a pulsating waveform as obtained by half-wave rectifying the alternating current, as shown in FIG. 4B.

When determining at step S3 that the input voltage Vk has a DC waveform, the control circuit 47 advances to step S4 to determine whether the input voltage Vk is at or above a set reference voltage or whether the leak is substantially harmless. Regarding this determination, the leak current is sometimes feeble depending upon the magnitude of leak resistance even when leak has occurred. In this case, the leak current is substantially harmless. It is unpractical to determine occurrence of leak on the basis of this feeble leak current. As shown in FIG. 5A, occurrence of leak may not be determined when the leak current is below 0.17 mA, for example. The voltage Vk corresponding to the current of 0.17 mA is at 1.7 V. This value is set as a reference voltage for detection of the DC waveform. When an average value of the voltages Vk is at or above the reference voltage, the control circuit 47 determines that leak has occurred, advancing to step S5.

At step S5, the control circuit 47 controls the display of the display circuit 59 so that an indication or information to the effect that leak has occurred is displayed, stopping the control. The control circuit 47 advances to a next control step when determining at step S4 that no substantial leak has occurred. On the other hand, when determining at step S3 that the voltage Vk has a pulsating waveform, the control circuit 47 advances to step S6 where the control circuit 47 compares a peak value of the generated voltage Vk with a reference voltage set for the pulsating waveform or 1.36 V in this case. When the peak value is at or above 1.36 V, the control circuit 47 determines that substantial leak has occurred, advancing to step S5. When the peak value is below 1.36 V, the control circuit 47 determines that no substantial leak has occurred, advancing to the next control step. The aforesaid reference voltage of 1.36 V corresponds to the leak current of 0.17 mA as shown in FIG. 5B.

In the foregoing embodiment, no voltage is applied to the windings 33u, 33v and 33w when no leak has occurred in the motor 33 while it is deenergized. However, when leak has occurred in the motor 33 during deenergization thereof, the leak current flows from the windings 33u, 33v and 33w to the resistor 60, whereupon the resistor generates the voltage Vk. Accordingly, leak in the motor 33 can be detected when the voltage generated in the resistor 60 is detected while the motor 33 is deenergized.

Further, since the leak is detected by such a simple and less expensive arrangement that the voltage-dividing resistor 60 is provided, the cost can be reduced and power consumption can be reduced. Additionally, leak can be detected without driving the motor. The electric power consumed in the leak detecting circuit is about 500 mW in the prior art. However, the electric power consumed in the resistor 60 is about 10 mW in the foregoing embodiment. Particularly, in the foregoing embodiment, the leak detection is performed before the start switch for the washing course is turned on after the power switch 35 has been turned on. A high level of safety can be ensured since the leak detection is thus carried out before operation of the motor 33.

The resistor 60 comprises the resistors 60a, 60b and 60c provided at the input sides of the windings 33u, 33v and 33w and the resistor 60d provided at the ground side and connected to the resistors 60a, 60b and 60c. Since the single resistor 60d is provided at the ground side, a cost reduction can be achieved and a desired leak detection can be carried out. Further, the control circuit 47 determines which the voltage Vk generated in the resistor 60 has, the dc waveform or pulsating waveform. The reference voltage is set according to the result of determination. The generated voltage Vk is compared with the reference voltage for leak detection. Consequently, the occurrence of leak can reliably be detected whether the outer cabinet 21 is grounded or not.

In this case when the control circuit 47 determines which the voltage Vk generated in the resistor 60 has, the dc waveform or pulsating waveform, the voltage is converted by A/D conversion in the period sufficiently shorter than the period of the commercial AC power supply. Accordingly, the voltage having the pulsating waveform can desirably be detected. The voltage with the pulsating waveform is formed by superimposition of the alternating current with the power supply frequency of the AC power source 34. Accordingly, it is effective to detect the waveform by the A/D conversion of the voltage with the pulsating waveform in the period sufficiently shorter than the period of the commercial AC power supply.

Figure 6:
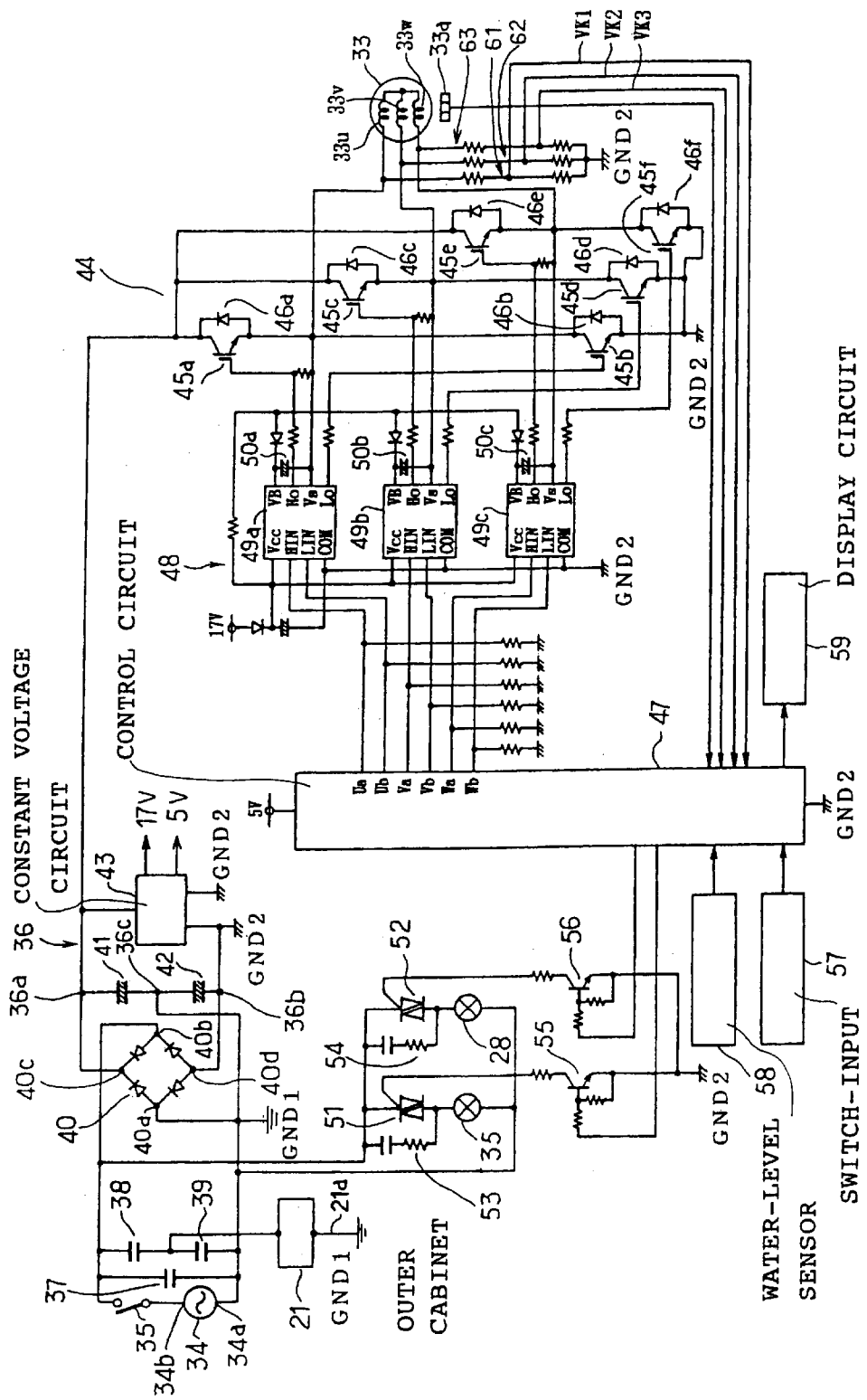
FIG. 6 is a view similar to FIG. 1, showing the washing machine of a second embodiment in accordance with the invention.

FIG. 6 illustrates a second embodiment of the invention. Three voltage-dividing resistors 61, 62, and 63 are provided for the respective phase windings 33u, 33v and 33w. Voltages Vk1, Vk2 and Vk3 generated by the respective phase windings 33u, 33v and 33w are delivered into the A/D converter of the control circuit 47. In this case, display (warning) is performed when leak has occurred in any one of the generated voltages Vk1, Vk2 and Vk3. Consequently, leak, which has occurred in any one of the phase windings, can reliably be detected.

Figure 7:
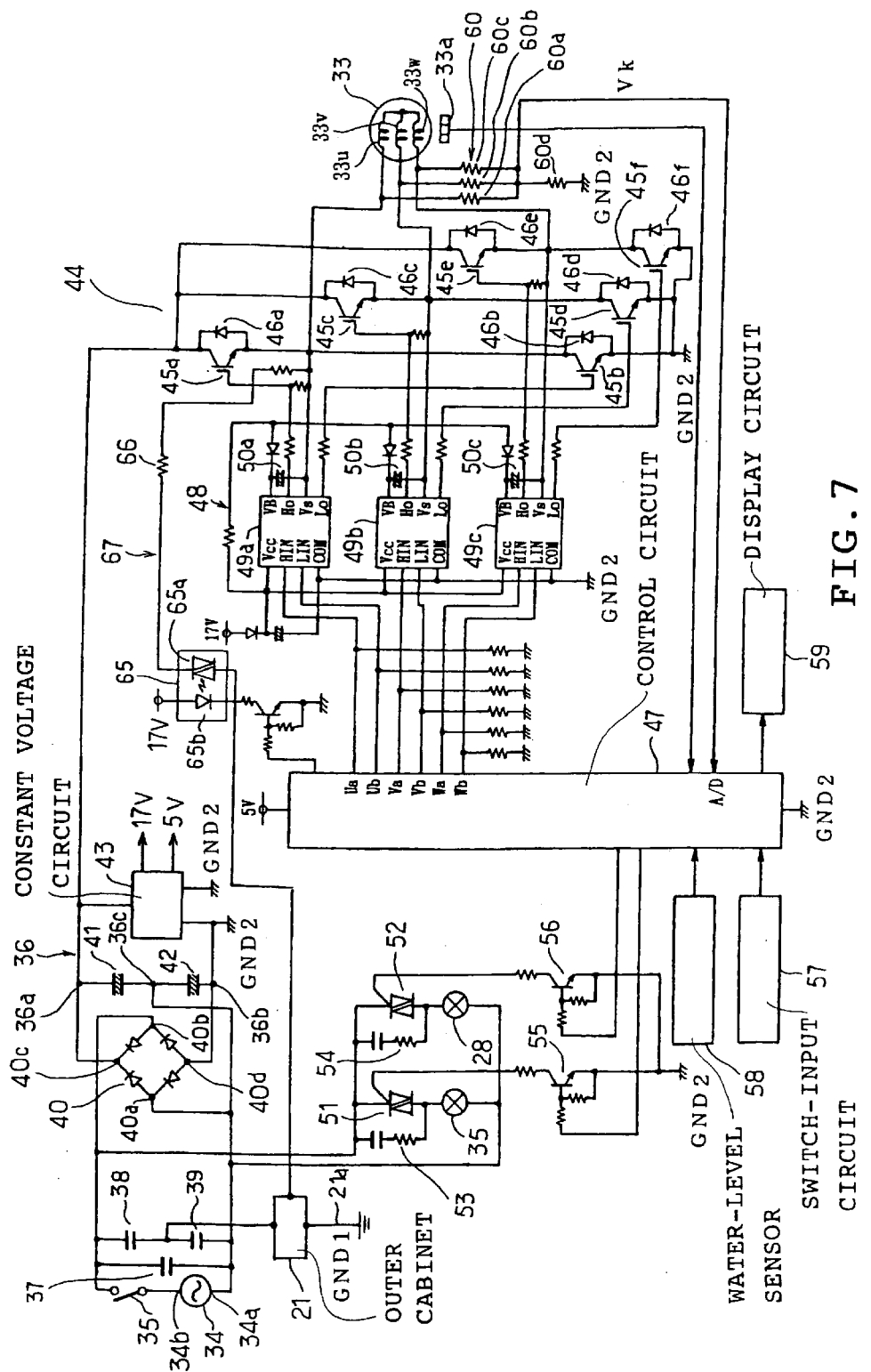
FIG. 7 is a view similar to FIG. 1, showing the washing machine of a third embodiment in accordance with the invention.
Figure 8:
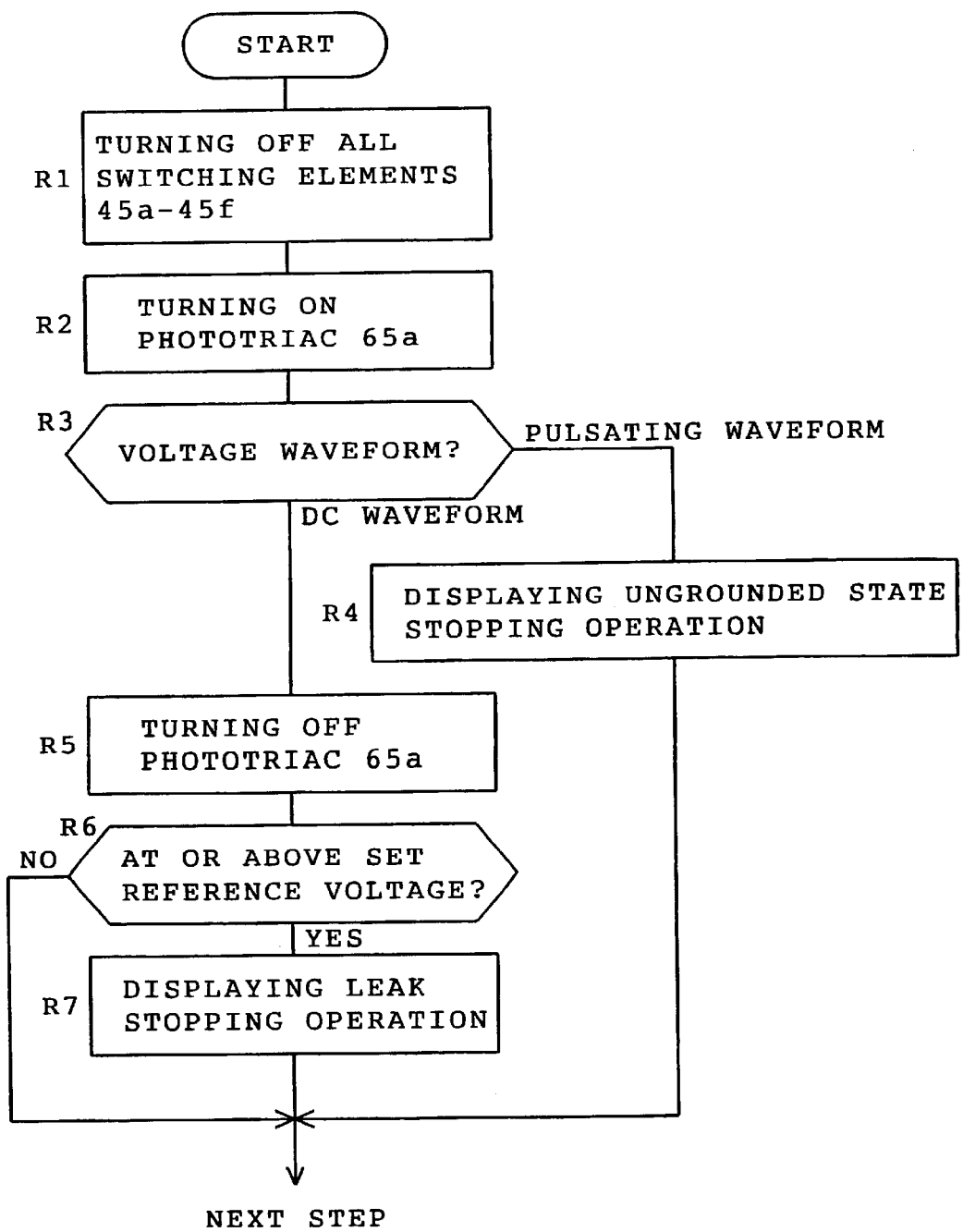
FIG. 8 is a flowchart showing the control contents of the control device.

FIGS. 7 and 8 illustrate a third embodiment of the invention. In the third embodiment, a ground detecting circuit 67 is connected between the outer cabinet 21 and the input side of the winding 33u, for example. The ground detecting circuit 65 comprises a series circuit of a phototriac 65a and a resistor 66 of a photocoupler 65 serving as a switching element. The photocoupler 65 includes a photodiode 65b turned on and off by the control circuit 47, whereby the pohototriac 65a is turned on and off. The control circuit 47 carries out the leak detecting control when the motor 33 is deenergized or before the start switch for the washing course is turned on. FIG. 8 shows the control manner of the control circuit 47. All the switching elements 45a to 45f are turned off at step R1. The phototriac 65a is turned on at step R2. Current then flows from the outer cabinet 21 side into the ground detecting circuit 67 toward the resistor 60. In other words, a false leak current flows. Accordingly, the resistor 60 generates voltage.

At step R3, the control circuit 47 determines which the generated voltage Vk has, the dc waveform or the pulsating waveform. That is, the control circuit 47 determines whether the user has connected the outer cabinet 21 via the earth wire 21a to the earth. When the outer cabinet 21 is grounded, the voltage Vk generated by the resistor 60 has the dc wavefrom. The voltage Vk has the pulsating waveform when the outer, cabinet 21 is not grounded. When determining at step R3 that the generated voltage Vk has the pulsating waveform, the control circuit 47 advances to step R4 where the ungrounded state of the outer cabinet 21 is displayed on the display of the display circuit 59 or informed of, then stopping the leak detection control.

When the generated voltage Vk has the dc waveform, the control circuit 47 advances to step R5 to turn off the phototriac 65a of the photocoupler 65. In this case, when voltage has been generated by the resistor 60, leak has occurred, and the voltage has the dc waveform as shown in FIG. 4A showing the waveform in the case where the outer cabinet 21 is grounded. Thereafter, the control circuit 47 advances to step R6 to determine whether the generated voltage Vk is below the reference voltage of 1.7 V as shown in FIG. 5A showing the case where the outer cabinet 21 is grounded. When the generated voltage Vk is at or above the reference voltage of 1.7 V, the control circuit 47 determines that a substantial leak has occurred, advancing to step R7. At step R7, the control circuit 47 controls the display of the display circuit 59 so that the indication or information of occurrence of leak is displayed on the display, stopping the leak detection control.

According to the third embodiment, whether the user has grounded the outer cabinet 21 can be judged by determining which waveform the voltage Vk generated in the resistor 60 as the result of occurrence of leak has, the dc waveform or the pulsating waveform. However, this can be determined first after leak has occurred. In the third embodiment, the ground detecting circuit 67 is connected between the outer cabinet 21 and the input side of the winding 33u and comprises the series circuit of the phototriac 65a and the resistor 66 of the photocoupler 65 is turned on, a false leak can be produced. The control circuit 47 determines which waveform the voltage Vk appearing in the resistor 60 in the false leak condition has, the dc waveform or the pulsating waveform, thereby determining whether the user has grounded the outer cabinet 21. Warning is carried out when the generated voltage Vk has the pulsating waveform. Consequently, the ungrounded state of the outer cabinet 21 can be informed of.

In the third embodiment, the ground detecting circuit 67 is connected between the outer cabinet 21 and the input side of the winding 33u and comprises the series circuit of the phototriac 65a and the resistor 66 of the photocoupler 65 serving as the switching element. However, the ground detecting circuit 67 may be connected between the outer cabinet 21 and another winding 33v or 33w, instead. Further, the ground detecting circuit 67 may be connected between the earth wire 21a and the input side of the winding.

Figure 9:
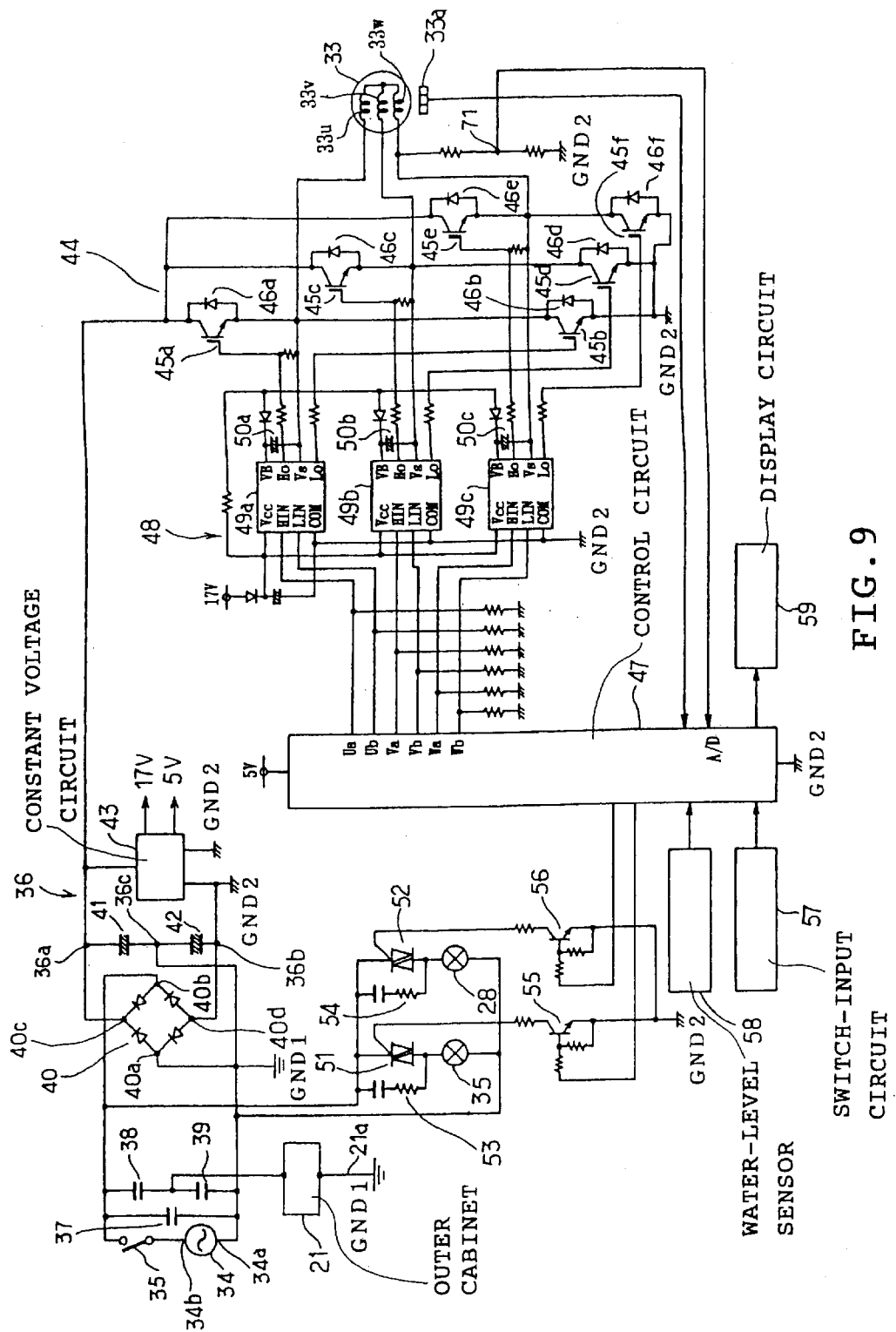
FIG. 9 is a view similar to FIG. 1, showing the washing machine of a fourth embodiment in accordance with the invention.
Figure 10:
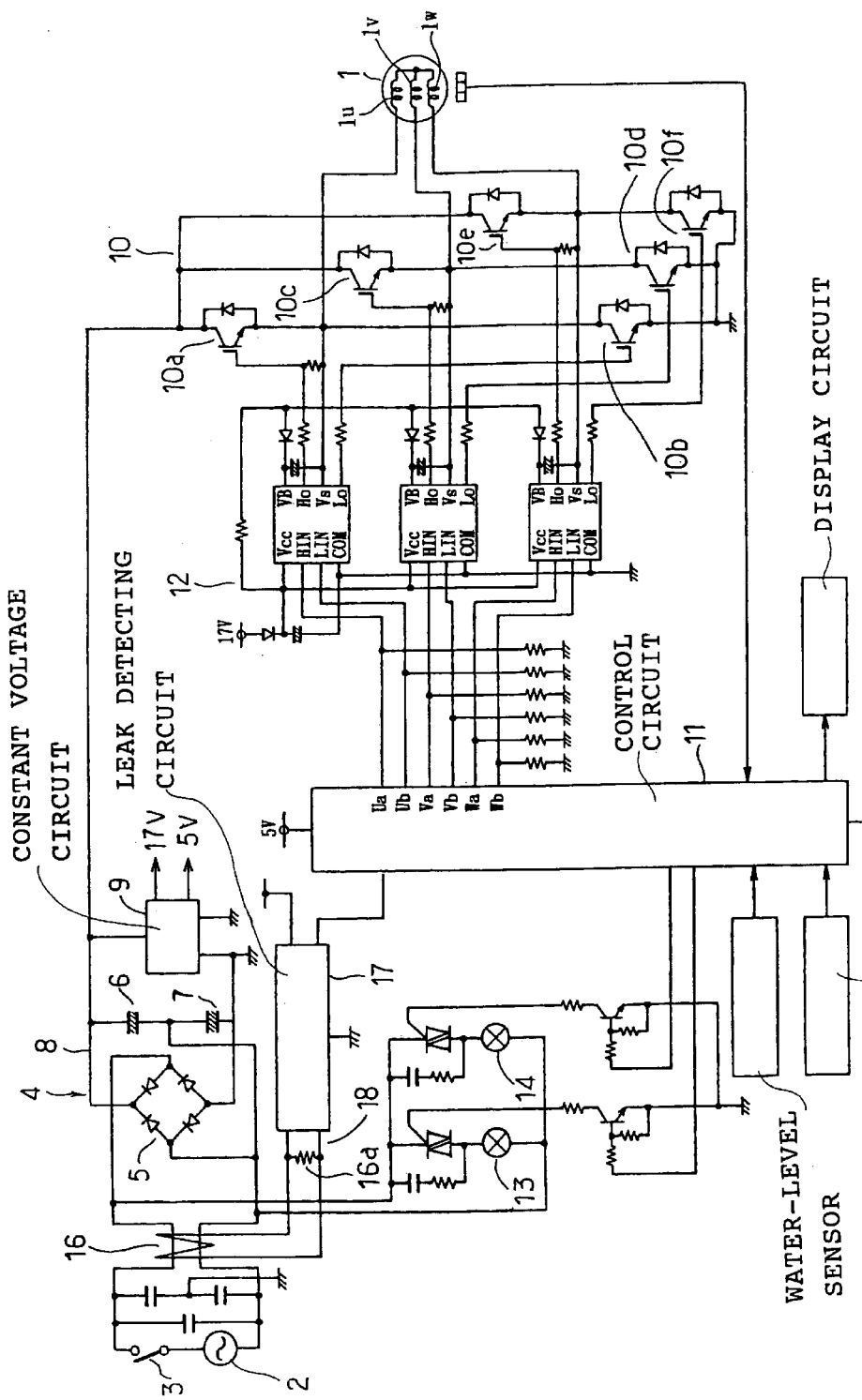
FIG. 10 is also a view similar to FIG. 1, showing a prior art.

FIG. 9 illustrates a fourth embodiment of the invention. The voltage-dividing resistor 71 is provided on any one of the phase windings 33u, 33v and 33w, for example, on the phase W winding 33w. Since only one set of the resistor 71 is required, the arrangement can be simplified and accordingly, the cost can be reduced. When the resistor 71 is provided on the single phase, the detection accuracy may be reduced slightly but results in no problem in the practical use.

Although the present invention is applied to the washing machine in the foregoing embodiments, it can be applied to various types of electrical equipment with an electric motor.

The foregoing description and drawings are merely illustrative of the principles of the present invention and are not to be construed in a limiting sense. Various changes and modifications will become apparent to those of ordinary skill in the art. All such changes and modifications are seen to fall within the scope of the invention as defined by the appended claims.

We claim:

1. A current leak detection method for a washing machine provided with an electric motor, an inverter circuit driving the electric motor and a voltage doubler rectifier circuit supplying driving power to the inverter circuit and including two capacitors having a neutral point connected to a grounded side of an AC power supply, the voltage double rectifier circuit having a ground potential set to be equal to a ground potential of an internal circuit of the washing machine, the washing machine comprising an outer cabinet having a potential set at a value differing from the ground potential of the internal circuit thereof, the method comprising detecting, during non-energization of the motor, a voltage generated in a voltage-dividing resistor provided between a power input side of a winding of the motor and a ground on the internal circuit, thereby detecting current leak produced between the motor and the outer cabinet of the washing machine.

2. The current leak detection method according to claim 1, wherein the current leak detection is carried out after the washing machine is connected to a power supply and before the motor is operated.

3. The current leak detection method according to claim 1, wherein the motor includes a plurality of phase windings and a plurality of the voltage dividing resistors are provided for the respective phase windings.

4. The current leak detection method according to claim 1, wherein the motor has a plurality of phase-windings, the voltage dividing resistor includes a plurality of first resistors provided at input sides of the phase windings respectively and a single second resistor provided at the ground side and connected to the first resistors.

5. The current leak detection method according to claim 1, further comprising:

connecting a ground detecting circuit having a series circuit of a switching element and a resistor between the outer housing of the washing machine or an earth wire provided on the housing and a power input side of the winding;

turning on the switching element to determine which voltage generated in the voltage-dividing resistor has, a dc waveform or a pulsating waveform; and warning when the voltage has the pulsating waveform.

6. The current leak detection method according to claim 1, wherein the voltage-dividing resistor is provided on one of the phase windings.

7. A current leak detection method for a washing machine provided with an electric motor energized from a DC power supply obtained by converting an AC power supply, the washing machine comprising an outer cabinet having a potential set at a value differing from a ground potential of an internal circuit thereof, the method comprising detecting, during non-energization of the motor, a voltage generated in a voltage-dividing resistor provided between a power input side of a winding of the motor and a ground on the internal circuit, determining if the voltage generated in the voltage-dividing resistor has a DC waveform or a pulsating waveform, with the outer cabinet of the washing machine being connected to a neutral point of a capacitor dividing the AC power supply, setting a reference voltage according to a result of determination, and comparing the voltage produced in the voltage-dividing resistor with the reference value, thereby detecting the current leak produced between the motor and the outer cabinet of the washing machine.

8. The current leak detection method according to claim 7, wherein the voltage is converted by A/D conversion in a period sufficiently shorter than a period of the commercial AC power supply so that waveform detection is performed.

9. The current leak detection method according to claim 7, further comprising:

connecting a ground detecting circuit having a series circuit of a switching element and a resistor between the outer housing of the washing machine or an earth wire provided on the housing and a power input side of the winding;

turning on the switching element to determine which voltage generated in the voltage-dividing resistor has, a dc waveform or a pulsating waveform; and warning when the voltage has the pulsating waveform.

* * * * *